United States Patent

Wong et al.

[11] Patent Number: 5,457,427
[45] Date of Patent: Oct. 10, 1995

[54] HIGH-FREQUENCY AMPLIFIER MEANS WITH ENHANCED OUTPUT RESISTANCE

[75] Inventors: Stephen L. Wong, Scarsdale, N.Y.;
Jose M. Garcia, North Bergen, N.J.

[73] Assignee: Philips Electronics North America Corporation, New York, N.Y.

[21] Appl. No.: 236,772

[22] Filed: Apr. 29, 1994

[51] Int. Cl.⁶ ........................................ H03F 3/191
[52] U.S. Cl. ............................... 330/302; 330/306
[58] Field of Search ............................. 330/292, 294, 330/302, 303, 306

[56]     References Cited

U.S. PATENT DOCUMENTS 5,117,203  5/1992  Tennyson .................... 330/302 X
5,146,178  9/1992  Nojima et al. ................ 330/306 X
5,315,265  5/1994  Wisherd et al. .............. 330/306 X
5,339,047  8/1994  Mizan et al. ................. 330/306 X Primary Examiner—Steven Mottola
Attorney, Agent, or Firm—Robert J. Kraus

[57]     ABSTRACT

The input impedance of a high-frequency monolithic integrated-circuit amplifier is modified to increase the maximum output power capability of the amplifier. This modification compensates for a reduction in output resistance at high frequencies caused by feedback capacitance coupling the output and input of the amplifier.

13 Claims, 4 Drawing Sheets

B

HIGH-FREQUENCY AMPLIFIER MEANS WITH ENHANCED OUTPUT RESISTANCE

BACKGROUND OF THE INVENTION

1. Field of the Invention

The invention relates to high-frequency amplifier circuits, and in particular to monolithic integrated-circuit amplifiers having improved output power capabilities at high frequencies.

2. Description of Related Art

Monolithic integrated-circuit amplifiers have the advantages of small size and low cost. When utilized at high frequencies, however, the maximum output power capabilities of such amplifiers decrease to values which are substantially lower than those at lower frequencies. As used in this patent application, the term high frequency means any frequency above the 3 dB rolloff frequency, which is the frequency at which the gain drops more than 3 dB below the nominal DC open-loop gain of the amplifier. The decrease in maximum output power with frequency is typically attributable to a variety of causes.

One typical cause is a limitation on the peak output current imposed by parasitic inductances of the bonding wires and the integrated circuit leadframe used to supply current to the amplifier. Generally, these inductances cannot be decreased in a cost effective manner.

Another cause of the decrease in output power capability is a reduction in the output resistance $R_{OUT}$ of an amplifier which occurs at high frequencies. Typically, an amplifier is operated at or near its maximum output current $I_o$ to achieve maximum output power. From the general equation for output power (i.e. $P_o = \frac{1}{2} I_o^2 R_{OUT}$), it is apparent that any decrease in output resistance will cause a corresponding decrease in output power.

SUMMARY OF THE INVENTION

It is an object of the invention to provide a monolithic integrated-circuit amplifier having an increased output power capability at high frequencies.

Applicants have determined that a principal cause of the decrease in output resistance is feedback capacitance coupling the output of an amplifier to its input. Virtually all monolithic integrated-circuit amplifiers have such feedback capacitance, whether in the form of discrete or parasitic capacitance or a combination of both forms.

FIG. 1 is a small-signal equivalent circuit for a typical transistor amplifier. This equivalent circuit generally describes any one of a variety of transistor amplifiers which include one or more junction and/or MOS (metal-oxide-silicon) transistors. Examples include a transistor connected in a common-emitter configuration or a common source configuration.

In the equivalent circuit, the elements $r_i$ and $C_i$ represent parallel equivalents of resistance and capacitance, respectively, associated with the input IN of the amplifier. Similarly, the elements $r_o$ and $i_o'$ represent parallel equivalents of resistance and current associated with the output OUT of the amplifier. The current $i_o'$ is equal to the product of $g_m$ and $v_i$, where $g_m$ is the input-to-output transconductance of the amplifier and $v_i$ is the magnitude of a voltage across the resistance $r_i$. The final element in the equivalent circuit is a capacitance $C_f$ which represents the feedback capacitance coupling the output and input of the amplifier.

The manner in which the feedback capacitance $C_f$ affects the output resistance $R_{OUT}$ of the amplifier is illustrated graphically in FIG. 2 and described by the following equation:

$$R_{OUT} = \left[ \frac{C_i}{g_m C_f} \right] \left[ 1 + \left( \frac{1}{r_i} \right)^2 \left( \frac{1}{[2\pi f C_i]^2} \right) \right] \quad (1)$$

where f is the operating frequency of the amplifier.

Specifically, at operating frequencies lower than $f_{3dB}$ (which is equal to the value $\frac{1}{2\pi r_i C_i}$) the impedance of the capacitance $C_f$ is very large in comparison with that of the resistance $r_o$ (e.g. at least 4:1) and does not substantially affect the output resistance $R_{OUT}$ of the amplifier. That is, if a current source is connected to the output terminal OUT, very little current from the source will flow through the capacitance $C_f$ (and the parallel combination of $r_i$ and $C_i$ in series with $C_f$) and virtually all of the current $i_o$ entering the output terminal will flow through the resistance $r_o$. In this case:

$$R_{OUT} = r_o \quad (2)$$

Conversely, as the operating frequency of the amplifier is substantially increased above the frequency $f_{3dB}$ the impedance of the capacitance $C_f$ decreases relative to that of $r_o$. In this situation, if a current source supplying an output current $i_o$ is connected to the output OUT a significant portion of the current from the source will flow through $C_f$ and the parallel combination of $r_i$ and $C_i$. The portion of that current flowing through $r_i$ will increase the voltage $v_i$ and result in a substantial portion of the output current $i_o$ being diverted from $r_o$ and contributing to the current $i_o'$. This will bring about a decrease in the effective output resistance $R_{OUT}$ of the amplifier, which is equal to $v_o/i_o$, where $v_o$ is the voltage drop across the resistance $r_o$. As the operating frequency is increased above the value $\frac{1}{2\pi r_i C_i}$ the effective output resistance approaches the value:

$$R_{OUT} = C_i/C_f g_m \quad (3)$$

In accordance with the invention, an input-impedance-modifying stage is coupled to the input of an amplifier stage of the type having a feedback capacitance which brings about a decrease in the effective output resistance $R_{OUT}$ as described. The input-impedance-modifying stage has an output impedance which is coupled to the input impedance of the amplifier stage. These two impedances have a combined magnitude which is significantly smaller than the magnitude of the amplifier-stage input impedance alone and which functions as a smaller effective input impedance of the overall amplifier means. The current flowing through this smaller effective input impedance produces a significantly smaller voltage drop and brings about a decrease in the current $i_o'$. This in turn causes an increase in the portion of the output current $i_o$ flowing through $r_o$ and thus a corresponding increase in the effective output resistance of the amplifier means.

DESCRIPTION OF THE PREFERRED EMBODIMENTS

Figure 3:
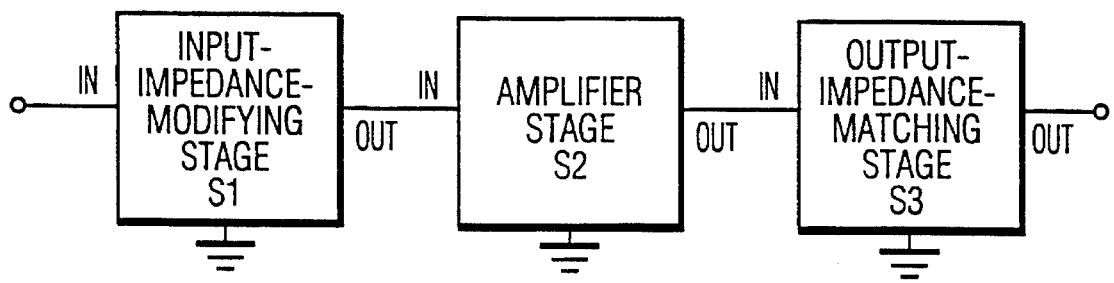
FIG. 3 is a block diagram illustrating a practical application of a first embodiment of the invention.

FIG. 3 illustrates an exemplary three-stage network incorporating a monolithic integrated-circuit amplifier means in accordance with the invention. The amplifier means itself comprises an input-impedance-modifying stage S1 and an amplifier stage S2. The network also includes a conventional output-impedance-matching stage S3 for matching the output impedance of the amplifier stage to the input impedance of a subsequent stage or to a load impedance (not shown). Typically stage S3 presents at its output only the real component (i.e. $R_{OUT}$) of the amplifier stage output impedance and cancels any reactive component of the output impedance (e.g. by resonance) over a predetermined operating frequency range.

Figure 1:
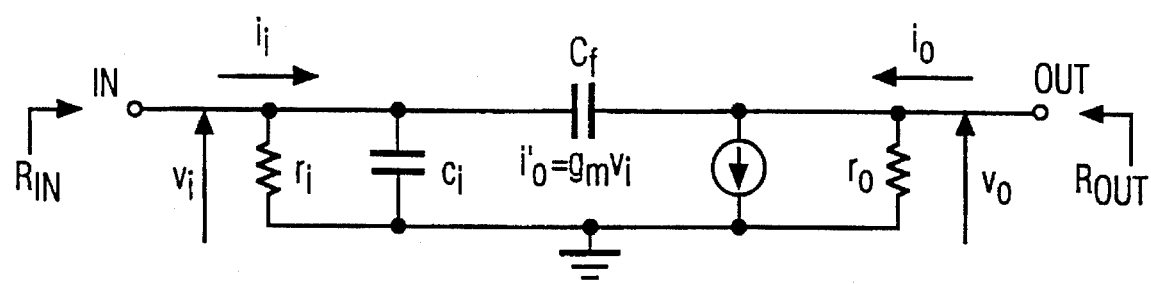
FIG. 1 is a schematic illustration of an equivalent circuit useful in explaining the invention.
Figure 2:
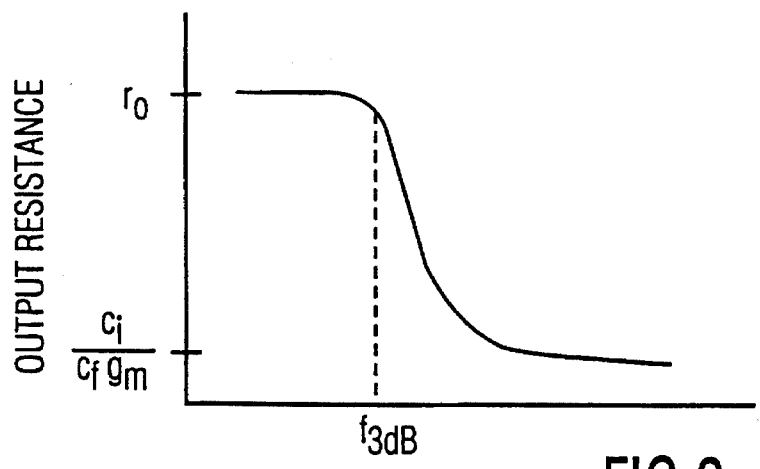
FIG. 2 is a graph representing the variation of output resistance as a function of operating frequency for the circuit of FIG. 1.

The amplifier stage itself may be one having the exemplary equivalent circuit of FIG. 1. Alternatively, it may be any other monolithic amplifier having an equivalent input impedance, comprising a resistance in parallel with a capacitance, that produces an output-resistance-reducing voltage which increases with current supplied through a feedback capacitance from the output of the amplifier stage. As an example of such an alternative, the amplifier stage may comprise an emitter follower stage in cascade with a common-emitter stage with feedback capacitance coupling the input and the output of the emitter-follower stage. The equivalent input impedance of the amplifier stage in this case would comprise the effective input resistance and capacitance of the emitter-follower stage.

The input-impedance-modifying stage S1 may take any one of a variety of forms, but each may be considered as having an output impedance which effectively comprises a resistance R' electrically connected in parallel with a capacitance C'. Several exemplary embodiments of circuitry which may be utilized to implement stage S1 are illustrated in FIGS. 4A through 4E.

Figure 4A:
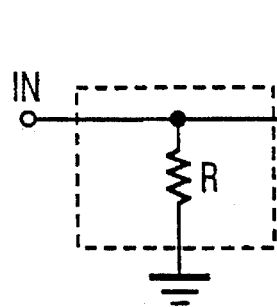
FIGS. 4A–4E are schematic illustrations of exemplary embodiments of an input-impedance-modifying stage in accordance with the invention.

FIG. 4A shows a version of stage S1 having only a resistance R coupling the input and output terminals of the stage to ground. This version has the advantage of simplicity, but a purely-resistive means for reducing the input impedance of the amplifier stage S2 consumes power at a level which may be objectionable.

Figure 4B:
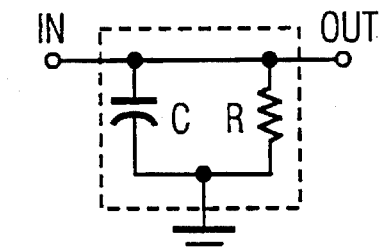

FIG. 4B shows a version of stage S1 having a parallel combination of a resistance R and a capacitance C coupling the input and output terminals of the stage to ground. The capacitance C may be a discrete element or may include output capacitance from a preceding stage (not shown) coupled to the input of stage S1. The parallel capacitance C reduces the input impedance of amplifier stage S2 without resorting to the use of a power-consuming resistance R as small as that of the FIG. 4A embodiment. However, this capacitance may significantly slow charging and discharging of a preceding stage's output capacitance unless the magnitude of C is much smaller than the output capacitance.

With either of the embodiments of input-impedance-modifying stage S1 shown in FIGS. 4A and 4B, an impedance-matching stage ordinarily will be inserted between the input of stage S1 and a preceding stage to be coupled to the amplifier stage. Such a stage will have a low output impedance, matching the input impedance of stage S1, and a high input impedance matching the output impedance of the preceding stage. This will prevent the decreased input impedance of the amplifier stage from excessively loading the output of the preceding stage.

Figure 4C:
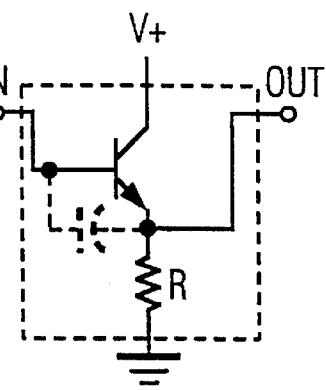
Figure 4D:
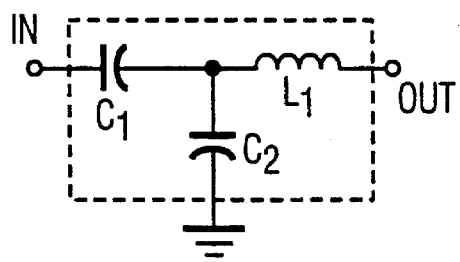
Figure 4E:
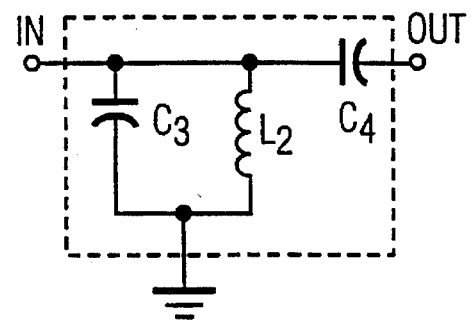

Alternatively, input-impedance-matching means may be incorporated in the input-impedance-modifying stage S1 itself. FIGS. 4C, 4D and 4E illustrate some alternative embodiments of such a stage.

FIG. 4C shows an embodiment of stage S1 including a resistor R and an active device (in this case a transistor) in which the capacitance C (shown in dashed lines) is intrinsic to the active device itself. FIGS. 4D and 4E illustrate two alternative embodiments of a stage S1 comprising capacitive and inductive elements which are electrically interconnected and have their magnitudes chosen so as to:

a. present at the output of the respective stage an effective impedance which appears as a resistance R' electrically connected in parallel with a capacitance C', as do the embodiments of FIGS. 4A and 4B; and b. present at the input of the respective stage an effective impedance which does not excessively load the output of a preceding stage.

The desired values of R' and C' depend on the configuration of the amplifier stage S2. For any such stage which may be represented by the equivalent circuit of FIG. 1, however, the values of R' and C' may be determined from the following equation:

$$R'_{OUT} = \left[ \frac{C_i + C'}{g_m C_f} \right] \left[ 1 + \left( \frac{1}{R'} + \frac{1}{r_i} \right)^2 \left( \frac{1}{[2\pi f(C_i + C')]^2} \right) \right] \quad (4)$$

From equation 4 it is apparent that the output impedance is increased to a value $R_{OUT}'$ only if either the magnitude of the resistance R' is less than infinity or the magnitude of the capacitance C' is greater than zero. These two situations (i.e. R'=∞, C'=0) are useful, however, in determining the individual effects of the resistance R' and the capacitance C' on the output resistance vs. frequency characteristic of the amplifier stage.

Figure 5:
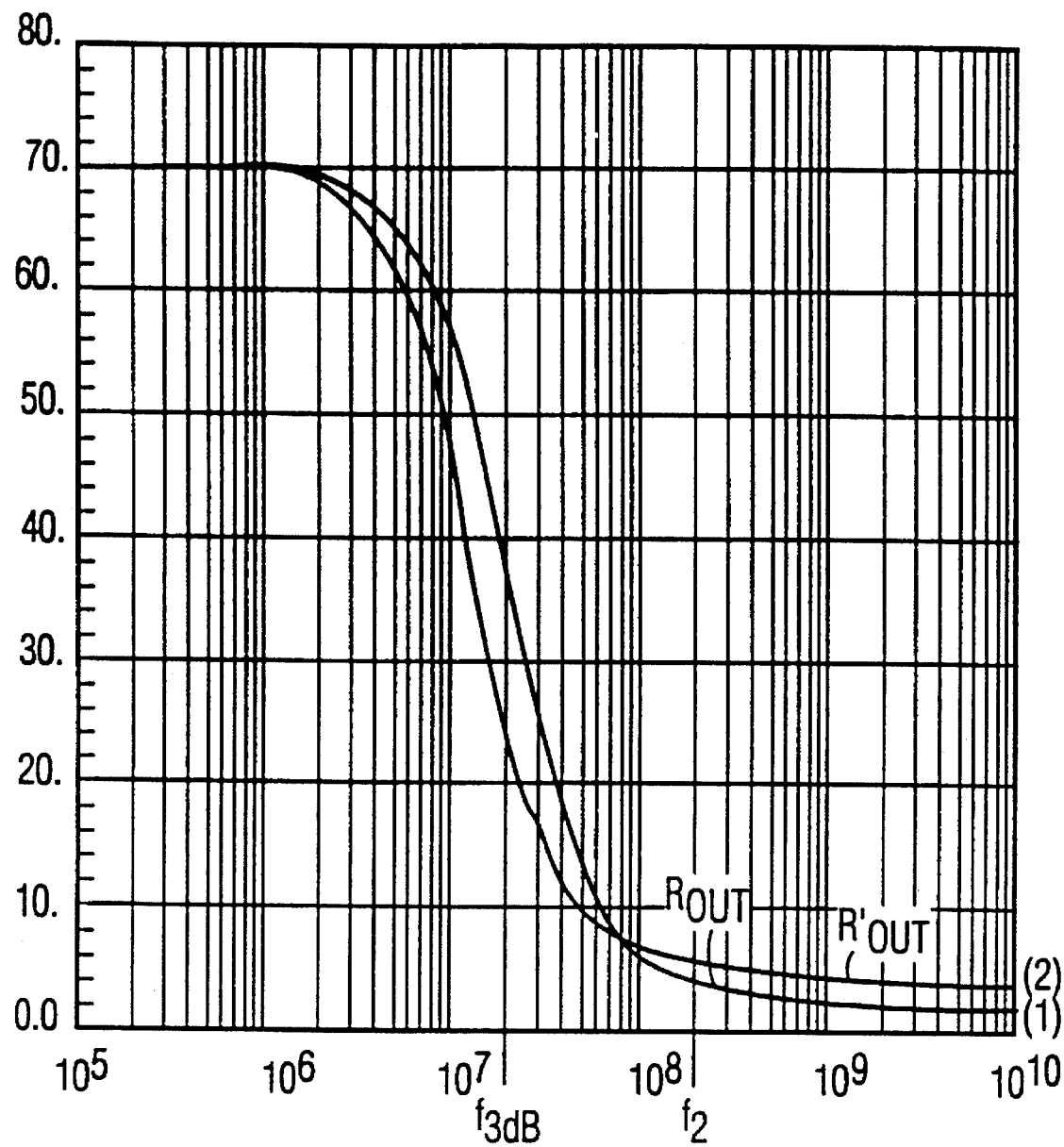
FIGS. 5A and 5B are graphs representing respective variations of output resistance as a function of operating frequency obtainable in accordance with the invention.
Figure 5A:
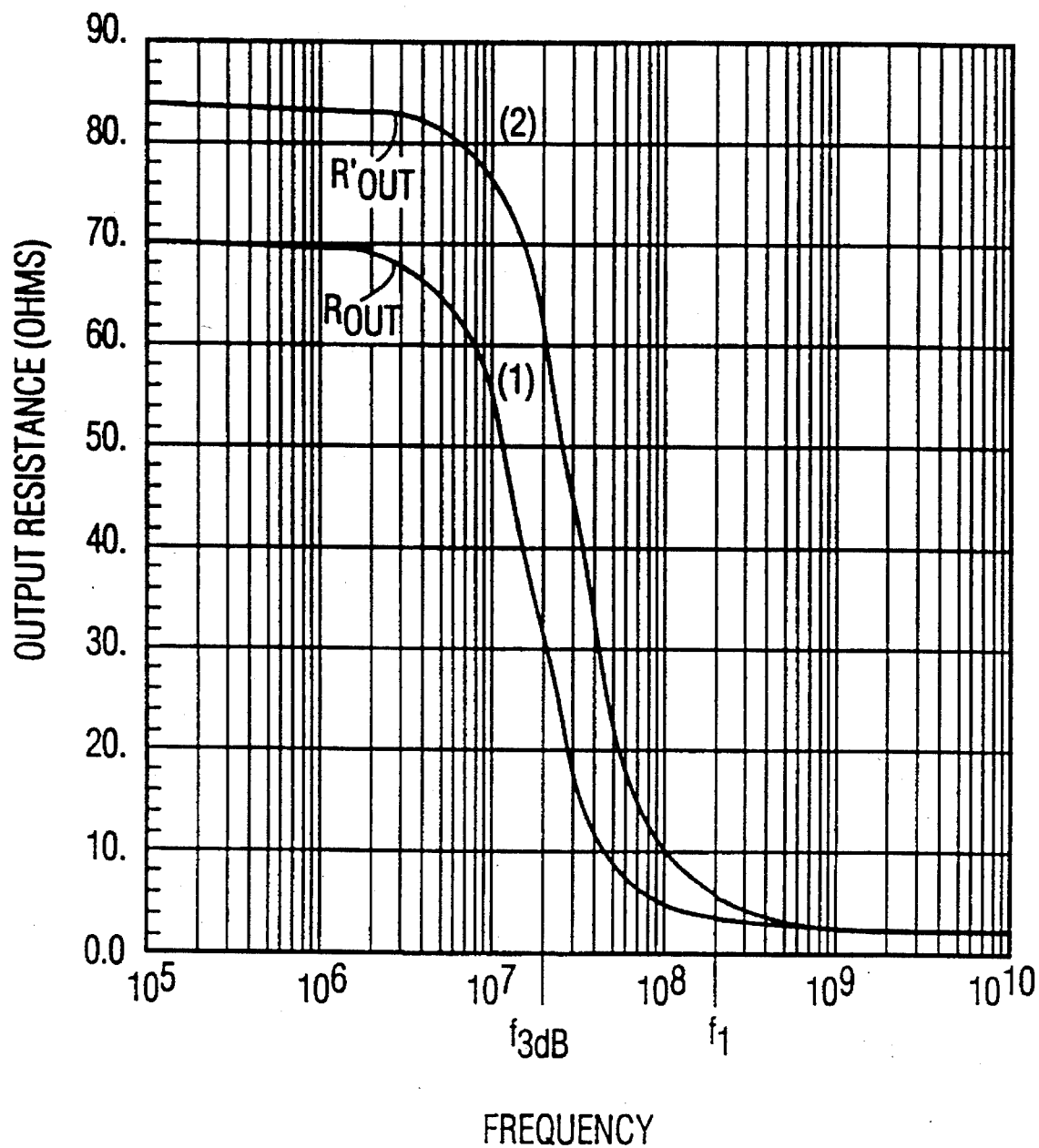

FIG. 5A illustrates characteristic curves representing a computer simulation of the variation of output resistance as a function of operating frequency. Curve 1 represents the situation that would exist if no input-impedance-modifying stage is present. Curve 2 represents the situation where stage S1 is present and where C'=0 and R'=$r_i$. From this figure it is apparent that by utilizing only a resistance R' of magnitude comparable to that of $r_i$ the output resistance is substantially increased. Specifically, the output resistance almost doubles over a frequency range which, in this example, extends from $f_{3dB}$ to $f_1$. If R' is increased above $r_i$ the increase in output resistance will become less substantial until, at R'=∞, no increase in output resistance above the original value $R_{OUT}$ will occur. Conversely, if R' is decreased below $r_i$ the increase in output resistance will become more substantial, but the loading effect on a preceding stage will also increase.

FIG. 5B illustrates characteristic curves representing a computer simulation of the variation of output resistance as a function of operating frequency. Curve 1 represents the situation that would exist if no input-impedance-modifying stage is present. Curve 2 represents the situation where stage S1 is present and where $R'=\infty$ and $C'=C_i$. In this case the output resistance almost doubles over a frequency range which, in this example, extends from $f_2$ to infinity. If $C'$ is decreased below $C_i$ the increase in output resistance will become less substantial until, at $C'=0$, no increase in output resistance above the original value $R_{OUT}$ occurs. Conversely, If $C'$ is increased above $C_i$ the increase in output resistance becomes more substantial, but the capacitive loading effect on a preceding stage will also increase.

Figure 6:
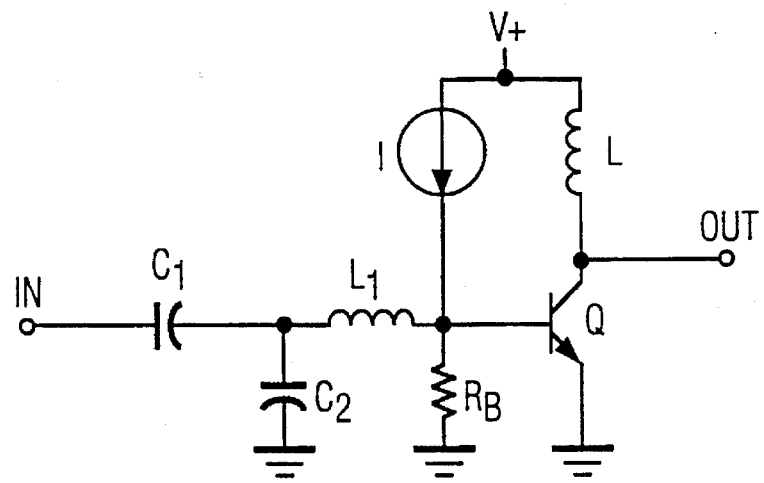
FIG. 6 is a schematic illustration of a combined input-impedance-modifying stage and amplifier stage in accordance with an embodiment of the invention.

FIG. 6 illustrates a practical embodiment of an amplifier means in accordance with the invention. The amplifier stage itself includes a power transistor Q, a DC-biasing circuit comprising a constant-current source I and a resistance $R_B$, and a choke L which functions as a pull-up device. The input-impedance-modifying stage comprises the circuit of FIG. 4D. Values for $L_1$, $C_1$ and $C_2$ will be chosen to obtain an effective output resistance R' and output capacitance C' which result in a desired balance between minimizing the loading of a preceding stage and maximizing the output resistance of the amplifier stage.

We claim:

1. A monolithic integrated-circuit amplifier means for operating over a predetermined range of high frequencies, said amplifier means including:

a. an amplifier stage having an output resistance, an equivalent input impedance comprising an input resistance electrically connected in parallel with an input capacitance, and feedback capacitance coupling the amplifier stage output to said input impedance, said coupling, during operation in said predetermined frequency range, contributing to a voltage drop across the input impedance which brings about a decrease in said output resistance; and b. an input-impedance-modifying stage having an output impedance coupled in parallel with the amplifier stage's input impedance, said output impedance having a magnitude which is significantly smaller than the magnitude of the input impedance, thereby significantly decreasing said voltage drop and increasing said output resistance in said predetermined frequency range.

2. An amplifier means as in claim 1 where the output impedance of the input-impedance-modifying stage comprises a resistive component.

3. An amplifier means as in claim 1 where the output impedance of the input-impedance-modifying stage includes an effective output resistance which is significantly smaller than the input resistance of the amplifier stage.

4. An amplifier means as in claim 1 where the output impedance of the input-impedance-modifying stage comprises a capacitive component.

5. An amplifier means as in claim 1 where the output impedance of the input-impedance-modifying stage includes an effective output capacitance which is significantly larger than the input capacitance of the amplifier stage.

6. An amplifier means as in claim 1 where the input-impedance-modifying stage comprises a resistance electrically connected in parallel with a capacitance.

7. An amplifier means as in claim 1 where the input-impedance-modifying stage comprises an inductance and at least one capacitance.

8. An amplifier means as in claim 1 where the input-impedance-modifying stage has an input impedance which is substantially equal to the output impedance of said stage.

9. An amplifier means as in claim 1 where the amplifier stage comprises a transistor.

10. An amplifier means as in claim 7 where the amplifier stage comprises a bipolar junction transistor.

11. An amplifier means as in claim 7 where the amplifier stage comprises a field-effect transistor.

12. An amplifier means as in claim 1 where the amplifier stage comprises a bipolar junction transistor and a DC current bias source coupled to a base of said transistor, and where the output impedance of the input-impedance-modifying stage includes an effective output resistance which is significantly smaller than the input resistance of the transistor.

13. An amplifier means as in claim 1 where the amplifier stage comprises a bipolar junction transistor and a DC current bias source coupled to a base of said transistor, and where the output impedance of the input-impedance-modifying stage includes an effective output capacitance which is significantly larger than the input capacitance of the transistor.

* * * * *